(12) United States Patent
Laudo

(10) Patent No.: US 7,155,085 B2
(45) Date of Patent: Dec. 26, 2006

(54) AMPLIFYING WAVELENGTH DIVISION MUX/DEMUX

(75) Inventor: John S. Laudo, Hilliard, OH (US)

(73) Assignee: Battelle Memorial Institute, Columbus, OH (US)

(*) Notice: Subject to any disclaimer, the term of this patent is extended or adjusted under 35 U.S.C. 154(b) by 235 days.

(21) Appl. No.: 10/706,263

(22) Filed: Nov. 12, 2003

(65) Prior Publication Data

US 2004/0096150 A1    May 20, 2004

Related U.S. Application Data

(60) Provisional application No. 60/425,939, filed on Nov. 13, 2002.

(51) Int. Cl.
*G02B 6/28* (2006.01)

(52) U.S. Cl. .................. 385/24; 385/15; 359/333

(58) Field of Classification Search ............ 385/15, 385/24
See application file for complete search history.

(56) References Cited

U.S. PATENT DOCUMENTS

| | | | |
|---|---|---|---|
| 4,387,955 A | 6/1983 | Ludman et al. | |
| 4,773,063 A | 9/1988 | Hunsperger et al. | |
| 5,107,359 A | 4/1992 | Ohuchida | |
| 5,206,920 A | 4/1993 | Cremer et al. | |
| 5,228,103 A | 7/1993 | Chen et al. | |
| 5,355,237 A | 10/1994 | Lang et al. | |
| 5,371,813 A * | 12/1994 | Artigue | 385/24 |
| 5,799,118 A | 8/1998 | Ogusu et al. | |
| 5,808,763 A | 9/1998 | Duck et al. | |
| 5,933,271 A | 8/1999 | Waarts et al. | |
| 6,049,417 A | 4/2000 | Srivastava et al. | |
| 6,049,418 A | 4/2000 | Srivastava et al. | |
| 6,094,284 A | 7/2000 | Huber | |
| 6,108,471 A | 8/2000 | Zhang et al. | |
| 6,111,674 A | 8/2000 | Bhagavatula | |
| 6,122,095 A | 9/2000 | Fatehi | |
| 6,137,933 A | 10/2000 | Hunter et al. | |
| 6,239,891 B1 | 5/2001 | Nakama | |
| 6,307,668 B1 | 10/2001 | Bastien et al. | |
| 6,330,090 B1 | 12/2001 | Martin et al. | |
| 6,339,662 B1 | 1/2002 | Koteles et al. | |
| 6,339,664 B1 | 1/2002 | Parker et al. | |

FOREIGN PATENT DOCUMENTS

| | | |
|---|---|---|
| DE | 42 05 750 A | 8/1993 |
| GB | 2 027 546 A | 2/1980 |
| WO | WO 02 37151 A | 5/2002 |

OTHER PUBLICATIONS

Weibin Huang and Richard R.A. Syms, Analysis of Folded Erbium-Doped Planar Waveguide Ampliers by the Method of Lines, Journal of Lightwave Technology, Dec. 1999, pp. 2658-2664, vol. 17, No. 12.

Poguntke, K.R. et al: "Design of a Multistripe Array Grating Integrated Cavity (Magic) Laser" Journal of Lightwave Technology, IEEE, New York, U.S. vol. 11, No. 12, Dec. 1, 1993, pp. 2191-2200.

(Continued)

Primary Examiner—Jennifer Doan
(74) Attorney, Agent, or Firm—Dinsmore & Shohl LLP

(57) ABSTRACT

An integrated optical device is provided comprising a waveguide body, a spectral combiner/divider, a primary input/output channel, and a set of displaced input/output channels. The waveguide body comprises an optical amplification medium configured to amplify different spectral components of a multi-component optical signal propagating there through.

65 Claims, 3 Drawing Sheets

OTHER PUBLICATIONS

Asghari, M. et al: "Demonstration of an Integrated Multichannel Grating Cavity Laser for WDM Applications", Electronics Letters, IEE Stevenage, GB, vol. 30, No. 20, Sep. 29, 1994, pp. 1674-1675.

Polman, A: "Exciting Erbium-doped Planar Optical Amplifier Materials", Thin Films for Optical Waveguide Devices and Materials for Optical Limiting Symposia (Materials Research Society Symposium Proc. vol. 597), Boston, MA., pp. 3-14, 2000.

Ishii, H. et al: "Zero Insertion Loss Operations in Monolithically Integrated WDM Channel Selectors", IEEE Photonics Technology Letters, IEEE Inc., New York, U.S., vol. 11, No. 2, Feb. 1999, pp. 242-244.

Parriaux, O. et al: "Normalized Analysis for the Sensitivity Optimization of Integrated Optical Evanescent-Wave Sensors", Journal of Lightwave Technology, IEEE, New York, U.S., vol. 16, No. 4, Apr. 1, 1998, pp. 573-582.

Wiki, M. et al: "Novel Integrated Optical Sensor Based on a Grating Coupler Triplet", Biosensors & Bioelectronics, Nov. 15, 1998, Elsevier, U.K., vol. 13, No. 11, pp. 1181-1185.

Cottier, K. et al: "Thickness-modulated Waveguides for Integrated Optical Sensing", Optical Fibers and Sensors for Medical Applications II, San Jose, CA, USA, Jan. 22-23, 2002, vol. 4616, pp. 53-63.

* cited by examiner

AMPLIFYING WAVELENGTH DIVISION MUX/DEMUX

CROSS REFERENCE TO RELATED APPLICATIONS

This application claims the benefit of U.S. Provisional Application Ser. No. 60/425,939, filed Nov. 13, 2002.

BACKGROUND OF THE INVENTION

The present invention relates generally to the propagation, direction, conditioning and other control of optical signals in optical devices and, more particularly, to the control of optical signals consisting of multiple spectral components. Modern telecommunications networks, for example, utilize a variety of optical components to affect control of multi-component optical signals. The present invention presents a scheme for addressing design and performance considerations related to handling multi-component optical signals of such networks.

For the purposes of defining and describing the present invention, it is noted that the use of the term "optical" throughout the present description and claims is not intended to define a limit to any particular wavelength or portion of the electromagnetic spectrum. Rather, the term "optical" is defined herein to cover any wavelength of electromagnetic radiation capable of propagating in a suitable signal propagating structure. For example, optical signals in the infrared regions of 850, 1350, 1400 and 1550 nm are commonly used in optical telecommunications.

BRIEF SUMMARY OF THE INVENTION

The present inventors have recognized a need for an improved scheme for the control of optical signals in optical devices and, more particularly, for improved control of multi-component optical signals. This need is met by the present invention.

In accordance with one embodiment of the present invention, an integrated optical device is provided comprising a waveguide body, a spectral combiner/divider, a primary input/output channel, and a set of displaced input/output channels. The waveguide body is configured to permit propagation of an optical signal having multiple spectral components. At least a substantial portion of the waveguide body comprises an optical amplification medium configured to amplify different spectral components of the multi-component optical signal. The spectral combiner/divider is near a boundary of the waveguide body and is configured such that (i) a spatial distribution of an optical signal propagating to and from the spectral combiner/divider is a function of respective component wavelengths of the multi-component optical signal, and (ii) a substantial portion of the optical signal propagates through the optical amplification medium. The primary input/output channel and the set of displaced input/output channels are defined in the waveguide body. The displacement of each of the displaced input/output channels from the primary input/output channel is defined at least in part by the spectral combiner/divider. A substantial portion of the optical signal in the primary input/output channel, the set of displaced input/output channels, or both, propagates through the optical amplification medium.

In accordance with another embodiment of the present invention, an integrated optical device is provided where the primary input/output channel defines a multidirectional path propagating through the optical amplification medium.

In accordance with yet another embodiment of the present invention, an integrated optical device is provided where the primary input/output channel defines a configuration designed to yield optical signal amplification sufficient to offset optical losses in the integrated optical device.

In accordance with yet another embodiment of the present invention, an integrated optical device is provided comprising an erbium or ytterbium-doped glass slab waveguide body and a spectral combiner/divider. The waveguide body is configured to permit propagation of an optical signal having multiple spectral components. The waveguide body is doped with sufficient erbium or ytterbium for amplification of different spectral components of the multi-component optical signal. The spectral combiner/divider is at a curved periphery of the waveguide body. The curved periphery and the spectral combiner/divider are configured such that the multi-component optical signal propagates from an input/output face of the waveguide body, through the waveguide body to the spectral combiner/divider at the curved periphery of the waveguide body, back through the waveguide body, as reflected by the spectral combiner/divider, and to the input/output face of the waveguide body. A spatially condensed optical signal propagating from the input/output face of the waveguide body to the spectral combiner/divider, and from the spectral combiner/divider to the input/output face, is spatially expanded by the spectral combiner/divider according to respective component wavelengths of the multi-component optical signal. A spatially expanded optical signal propagating from an input/output face of the waveguide body to the spectral combiner/divider, and from the spectral combiner/divider to the input/output face, is spatially condensed by the spectral combiner/divider according to respective component wavelengths of the multi-component optical signal. The spatially condensed optical signal propagating between the input/output face of the waveguide body and the spectral combiner/divider defines a primary input/output channel in the waveguide body. The spatially expanded optical signal propagating between the input/output face of the waveguide body and the spectral combiner/divider defines a set of displaced input/output channels in the waveguide body. The displacement of each of the displaced input/output channels from the primary input/output channel along the input/output face is defined by the spectral combiner/divider.

In accordance with yet another embodiment of the present invention, a telecommunications or other type of optical network is provided comprising at least one transmitter, at least one regenerator, and at least one receiver. The transmitter is configured to transmit an optical signal having multiple spectral components. The regenerator is configured to amplify the multi-component optical signal. The receiver is configured to receive the multi-component optical signal. The transmitter, regenerator, receiver, or combinations thereof, comprise one or more integrated optical devices according to the present invention.

Accordingly, it is an object of the present invention to provide for improved propagation, direction, conditioning and other control of optical signals in optical devices and optical networks. Other objects of the present invention will be apparent in light of the description of the invention embodied herein.

In accordance with yet another embodiment of the invention, an optical sensor is provided which uses the evanescent tail of the waveguiding region to sense the attachment of particles or materials on the surface of the waveguide in a multi-channel format.

BRIEF DESCRIPTION OF THE SEVERAL VIEWS OF THE DRAWINGS

The following detailed description of specific embodiments of the present invention can be best understood when read in conjunction with the following drawings, where like structure is indicated with like reference numerals and in which.

DETAILED DESCRIPTION

Figure 1:
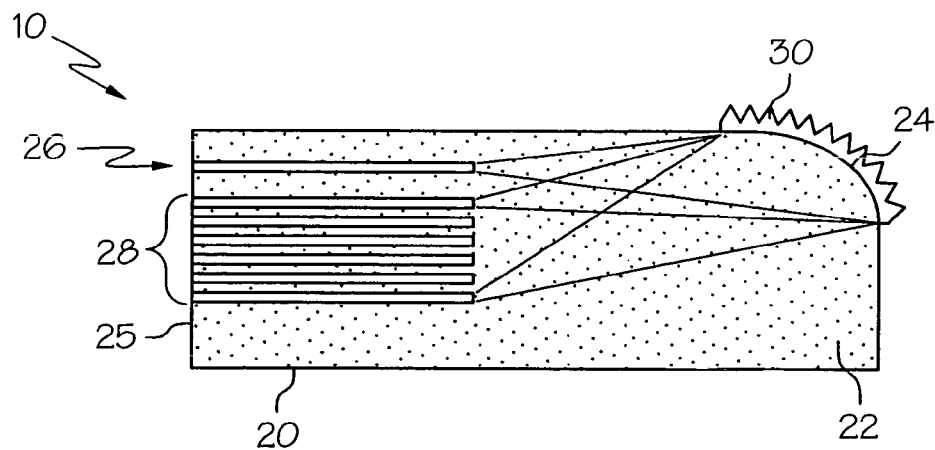
FIG. 1 is a schematic illustration of an integrated optical device in accordance with one embodiment of the present invention.

Referring initially to FIG. 1, an integrated optical device 10 according to one embodiment of the present invention is illustrated schematically. The integrated optical device 10 comprises a waveguide body 20, a spectral combiner/divider 30, a primary input/output channel 40, and a set of displaced input/output channels 50.

The waveguide body 20 is constructed of a material suitable for permitting propagation of an optical signal there through. For example, the waveguide body 20 may comprise silica or another glass, a polymeric material, or any other material suitable for propagation of optical signals having a plurality of different spectral components. Further, the waveguide body is configured to amplify different spectral components of the multi-component optical signal. For example, the waveguide body 20, or at least a substantial portion of it, may be doped with an optical amplification medium 22. Although the illustrated embodiment shows a waveguide body 20 where substantially all of the waveguide body 20 comprises the optical amplification medium 22, it is contemplated that suitable selective presentation of the optical amplification medium 22 would allow for provision of the optical amplification medium 22 in a lesser portion or a mere majority of the waveguide body 20.

The optical amplification medium receives light energy from an external source, e.g., a laser diode that pumps light into a fiber, and acts as a laser in its own right. The external light energy raises the energy level of atoms in the optical amplification medium 22, creating a population inversion of states. The population inversion of states is necessary for stimulated emission to occur. The emission stimulated in the optical amplification medium is coherent with and therefore amplifies the optical signal propagating through the waveguide body 20. In this manner, the optical signal propagates through the optical amplification medium 22 and may be subject to amplification by using, for example, a pump laser. Suitable dopants include erbium, neodymium, ytterbium, praseodymium, samarium, terbium, and other rare earth elements, transition metals, or other optically active elements. It is contemplated that the waveguide body may include other additives or dopants in addition to the optical amplification medium.

The spectral combiner/divider 30 is positioned near a boundary 24 of the waveguide body 20 and is configured to aid in multiplexing or demultiplexing the spectral components of an optical signal. The spatial distribution of an optical signal propagating to and from the spectral combiner/divider 30 is a function of the respective component wavelengths of the multi-component optical signal. More specifically, a spatially condensed, multiplexed multi-component optical signal propagating from an input/output face 25 of the waveguide body 20 to the spectral combiner/divider 30 is spatially expanded by the spectral combiner/divider 30 according to the respective component wavelengths of the multi-component optical signal. The signal is then directed back to the input/output face 25 as a spatially expanded, demultiplexed optical signal. Similarly, a spatially expanded, demultiplexed optical signal propagating from the input/output face 25 to the spectral combiner/divider 30 is spatially condensed by the spectral combiner/divider 30 according to respective component wavelengths of the multi-component optical signal. The signal is then directed back to the input/output face 25 as a spatially condensed, multiplexed optical signal.

The spectral combiner/divider 30 may take the form of a reflective grating structure (e.g., a reflective diffraction grating), as is illustrated in FIGS. 1–6. However, it is noted that any one or more of a plurality of suitable alternative structures may be employed to achieve spectral combination or division according to the present invention. For example, it is contemplated that an echelle grating, a holographically-formed reflective grating, a Rowland circle grating, a reflector stack, a wavelength selective interference filter, a flat specular reflection surface, a side-tap waveguide grating, a Bragg grating, and a super-dispersive prism formed by a photonic bandgap structure would all have utility in defining the spectral combiner/divider 30 of the present invention.

A primary input/output channel 26 and a set of displaced input/output channels 28 are defined in the waveguide body 20. Each of the displaced input/output channels 28 are displaced from the primary input/output channel 26 by a distance and direction that is defined, at least in part, by the optical characteristics of the spectral combiner/divider 30. For example, referring to the illustrated embodiments, where an optical signal to be demultiplexed is input through the input/output channel 26, the spectral combiner/divider 30 spatially distributes the signal based upon wavelength differences of components in the signal. The displaced input/output channels 28 are positioned to receive individual ones of the spatially distributed signals.

Figure 2:
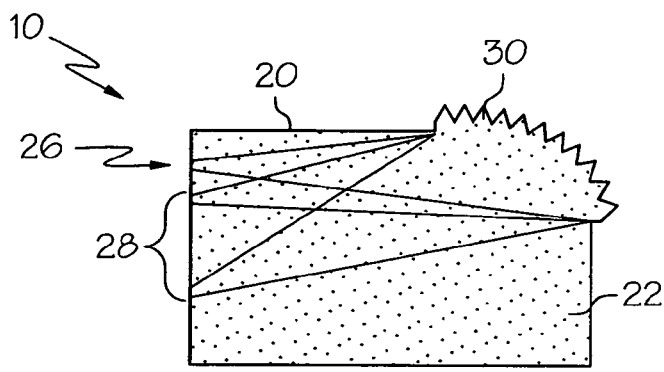
FIGS. 2–5 are schematic illustrations of integrated optical devices in accordance with alternative embodiments of the present invention.
Figure 3:
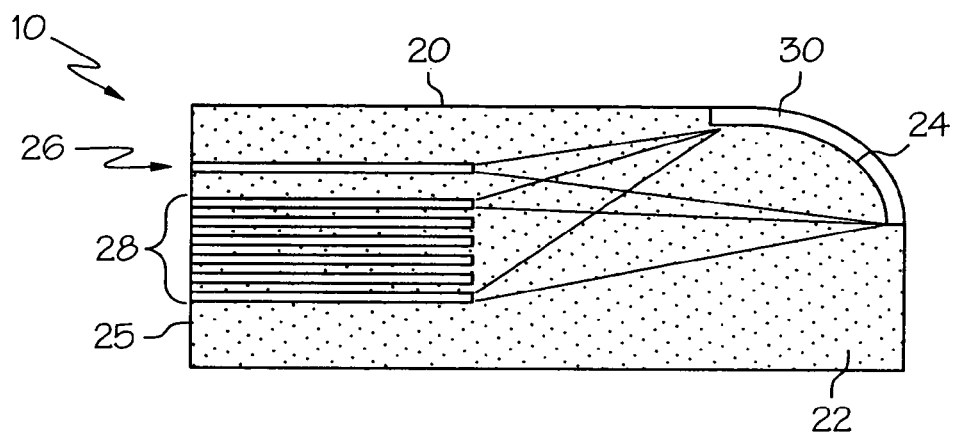
Figure 6:
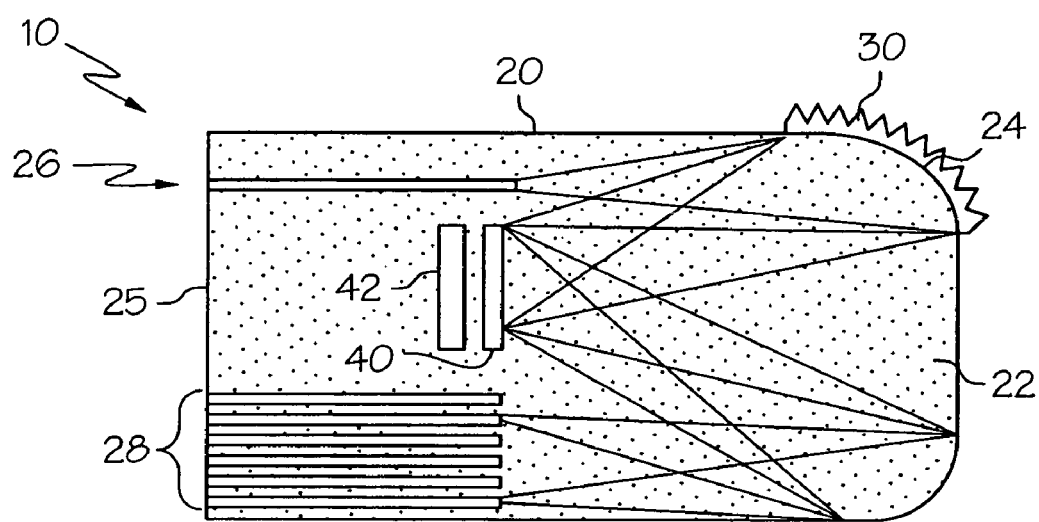
FIG. 6 is a schematic illustration of an integrated optical device in accordance with a further alternative embodiment of the present invention.

The primary input output channel 26, the spectral combiner/divider 30, and the set of displaced input/output channels 28 define a folded optical path along which the optical signal propagates. In the illustrated embodiment, the waveguide body 20, the spectral combiner/divider 30, and the optical amplification medium are configured such that substantially the entire optical signal propagating to the spectral combiner/divider 30 and substantially the entire optical signal propagating from the spectral combiner/divider 30 propagate through the optical amplification medium 22. At least a portion of the optical signal propagating to and from the spectral combiner/divider 30 should propagate through the optical amplification medium 22. In FIGS. 1–3, the optical amplification medium is present along both legs of the folded optical path. In the embodiment of FIG. 6, the optical amplification medium is present along all legs of the folded optical path. Of course, it is contemplated that the optical amplification medium 22 may be present along only one leg, or less than all legs, of the folded optical path.

In the embodiment illustrated in FIGS. 1 and 4–6, the spectral combiner/divider 30 is formed at an interface with the boundary 24 of the waveguide body 20 by securing it to the boundary 24 of the waveguide body 20. It may be preferable to provide for some type of optical coupling between the spectral combiner/divider 30 and the waveguide body 20. As is illustrated in FIG. 3, it is noted that the spectral combiner/divider 30 may be formed in the waveguide body 20 at the periphery of the body 20 or inland of the periphery. Similarly, as is illustrated in FIG. 2, the spectral combiner/divider 30 may be formed integral with the waveguide body 20, as an extension of the waveguide body 20.

Comparing FIGS. 1 and 2, it is noted that the primary input/output channel 26 and the set of displaced input/output channels 28 may be defined in the waveguide body 20 by input/output structure formed within the waveguide body or at an interface with the waveguide body 20. More specifically, in the embodiment of FIG. 1, the primary input/output channel 26 and the set of displaced input/output channels 28 are defined in the waveguide body 20 by suitable ridge or buried waveguides or other optical signal propagating structure. In contrast, referring to FIG. 2 the primary input/output channel 26 and the set of displaced input/output channels 28 are merely defined in the waveguide body 20 by suitable optical signal propagating structure (not shown) that is optically coupled to or formed at an interface with the waveguide body 20. To clarify, it is noted that a primary or displaced input/output channel may be "defined in" the waveguide body by providing input/output structure within the waveguide body, at an interface with the waveguide body, or coupled to the waveguide body.

Figure 4:
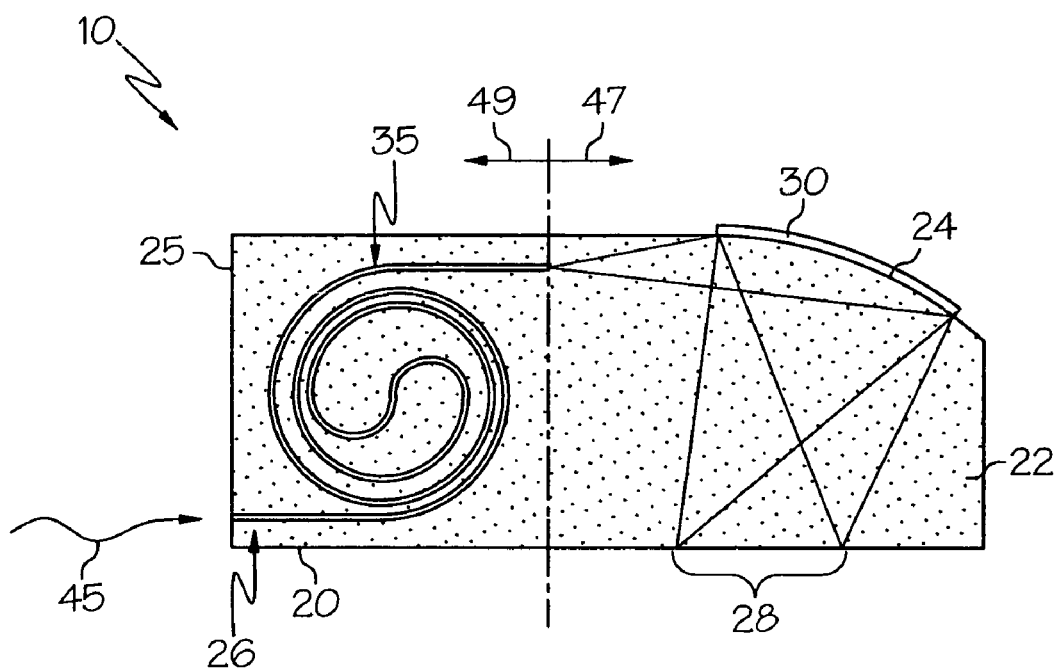
Figure 5:
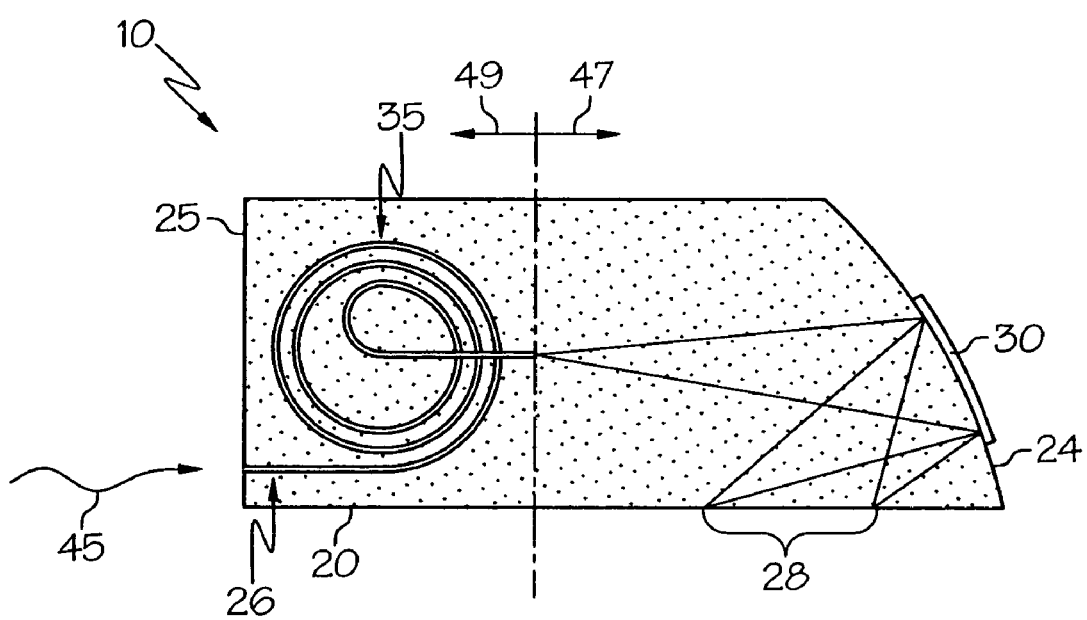

Turning to FIGS. 4 and 5, the primary input/output channel 26 may be presented as a multi-directional spiral waveguide 35 to maximize potential signal amplification and enhance the versatility of the integrated optical device 10 of the present invention. The spiral waveguide 35 may be configured to avoid crossing itself, as is illustrated in FIG. 4, or may be a folded spiral waveguide 35 that crosses itself at one or more points along the waveguide 35, as is illustrated in FIG. 5. The resulting increase in waveguide length allows for increased amplification using external light energy from a pump source 45 in the form of, for example, a pump laser. The structure of the spiral waveguide and the manner in which it is formed is beyond the scope of the present invention but may be gleaned from conventional and yet to be developed teachings on the subject of planar waveguides.

The spiral waveguides 35 of FIGS. 4 and 5 are well suited for tailoring the amplification of the optical signal to offset for optical losses of the integrated optical device 10 because the length of the optical path defined by the spiral waveguide 35 can be tailored to achieve optimum amplification. The level of amplification may be set to any desired value including a desired net gain value for the device. However, according to one embodiment of the present invention, the level of amplification is set to a value selected to offset optical losses, including but not limited to absorptive and insertion losses, throughout the optical device 10. For example, the energy density of the light from the external light source used for pumping the optical amplification medium 22 may be significantly reduced in specific low pump density areas 47 of the device 10. In these areas of relatively low pump density, the pump energy density may be too low to overcome the absorption losses attributable to the amplification medium, in which case the population inversion of states necessary for stimulated emission will not occur and absorptive optical losses will result. The effect of these optical losses can be offset by ensuring that the spiral waveguide 35 is positioned in relatively high pump density areas 49 and defines an optical path length in those areas that is sufficient to offset the losses in the relatively low pump density areas. Although the low and high pump density areas 47, 49 are delineated in FIGS. 4 and 5 with a clear demarcation between the two areas, the actual transition from one region to the next will be less definitely defined and may occur at a variety of locations in the device 10 depending partly upon the nature of the pump source.

The spiral waveguides illustrated in FIGS. 4 and 5 are referred to herein as "multi-directional" waveguides because the waveguide itself travels in at least two different directions to increase its path length in relatively high pump density areas 49. It is contemplated that any suitable multi-directional waveguide configuration may be utilized in place of the spiral waveguides 35 of FIGS. 4 and 5 to increase the available optical path length in the areas 49 of relatively high pump density.

Use of the spiral waveguide 35 also allows for the reduction of the dopant level of the optical amplification medium 22. Specifically, the dopant level of the entire optical device 10 may be reduced because the optical device 10 can be configured such that the spiral waveguide 35 defines an extended path length in areas of high pump density. Areas of relatively low pump density thus contribute less absorptive loss to the device as a whole because of the reduced dopant level. It is contemplated that an optimum dopant level and spiral waveguide configuration may be achieved to offset the overall absorptive loss of the optical device 10 or, more specifically, to balance the absorptive loss and the optical signal amplification of the device 10.

A variety of factors affect the degree to which the optical signal amplification offset the optical losses, including, but not limited to: (i) the optical configuration of the primary input/output channel, including characteristics such as its optical path length, geometry, and position within the high pump density areas; (ii) the choice of amplification medium dopant and dopant level; (iii) the length of the optical path in the low pump density area; and (iv) the overall device layout and configuration; and (iv) the curvature or focal length of the device. Any one or more of these factors can be utilized and controlled to achieve the gain/loss offset and balance described herein.

Returning briefly to the embodiments of FIGS. 1–3, where a substantially linear primary input/output channel 26 is utilized, it is contemplated that the dopant level in the device 10 and the length and position of the primary input/output channel 26 may also be optimized to achieve a desired gain or to offset or balance the overall optical loss of the optical device 10.

Referring to FIG. 6, an alternative integrated optical device 10 according to the present invention is illustrated. The device 10 includes a partially transmissive reflector 40 positioned along the folded optical path defined by the primary input output channel 26, the spectral combiner/divider 30, and the set of displaced input/output channels 28. An additional reflector 50 is provided at a curved periphery of the waveguide body 20 to enable redirection of an optical signal reflected by the partially transmissive reflector 40. In this manner, first, second, and third folds are defined in the optical path and the optical signal is directed along an optical path that begins and ends at the input/output face 25 of the waveguide body 20.

A detector 42 may be positioned along the optical path to detect that portion of the optical signal transmitted through the partially transmissive reflector 40. In this manner, the partially transmissive reflector 40 and the detector 42 function as an optical signal monitor in the folded optical path. It is contemplated that alternative structure may be provided to yield a suitable optical signal monitor.

It is further contemplated that block element 40 may alternatively comprise an optical signal filter 40 in the form of a wavelength selective reflector or another type of suitable filter. In this manner, the integrated optical device may be employed to permit transmission or reflection of only selected wavelength portions of the optical signal. It is noted that an optical signal filter may be positioned at any one of a number of suitable positions along the folded optical path. It is further noted that an optical signal filter 40 may be employed with the detector 42 as a filtered optical signal monitor to detect portions of the optical signal in one or more specific wavelength bands.

Figure 7:
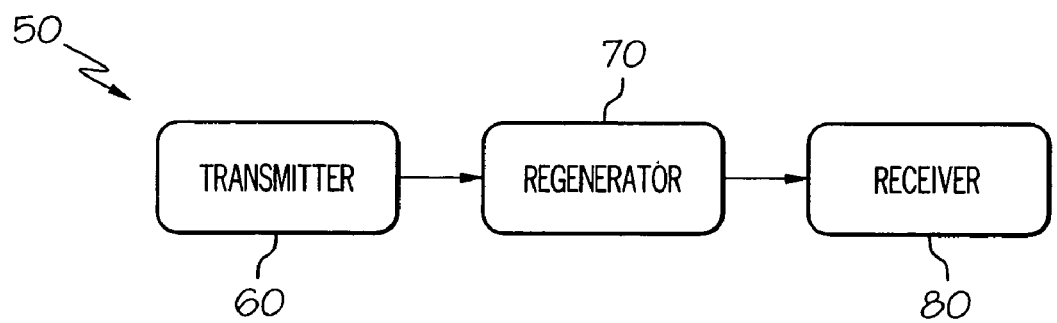
FIG. 7 is a schematic illustration of an optical network.

Referring to FIG. 7, we note that integrated optical devices of the present invention may be employed in a telecommunications or other type of optical network 50. Optical networks 50 typically comprise, among other things, transmitters 60, regenerators 70, and receivers 80. The optical transmitter 60 is configured to transmit an optical signal having multiple spectral components. The regenerator 70 is used to amplify the multi-component optical signal generated by the transmitter 60. The receiver 80 is configured to receive the multi-component optical signal generated by the transmitter and amplified by the regenerator. A given optical network 50 will typically employ a plurality of transmitters 60, regenerators 70, and receivers 80 and each of these components may control the optical signal in a variety of ways. Integrated optical devices according to the present invention will have utility in such components where the functionality of the component allows for, or requires, amplification of the optical signal as its spectral components are spatially expanded or condensed.

Typically, in telecommunications and other types of optical networks, an optical transmitter 60 will require multiplexing or spatial condensing of the spectral components of an optical signal while an optical receiver 80 will require demultiplexing or spatial expansion of an optical signal. Accordingly, it is contemplated that use of a multiplexing integrated optical device according to the present invention would be advantageous in the context of an optical transmitter 60 of an optical network. Similarly, it is contemplated that use of a demultiplexing integrated optical device according to the present invention, which can reduce the optical signal losses incurred by typical demultiplexers, would be advantageous in the context of an optical receiver 80. It is further contemplated that use of an integrated optical device according to the present invention may also be advantageous in the context of an optical regenerator 70. More specifically, where the transmitter 60 comprises an integrated optical device according to the present invention, the primary input/output channel 26 of the optical device is coupled to an input channel of the regenerator 70 or the receiver 80. Where the receiver 80 comprises an integrated optical device according to the present invention, the primary input/output channel 26 of the device is coupled to an output channel of the regenerator 70 or the transmitter.

It is further contemplated that an integrated optical device according to the present invention may be employed as an optical sensor by utilizing the evanescent tail of the waveguiding region of the waveguide body 20 to sense the attachment of particles or materials on the surface of the waveguide body 20. Specifically, particles or materials present on the surface of the waveguiding region will lead to attenuation of the evanescent field. This attenuation can be detected at the output of the device as changes in the output spectrum or otherwise. The nature of the attenuation will be indicative of the presence of certain particles or materials, i.e., chemical materials, biological material, inorganic or organic materials, etc. The set of displaced input/output channels 28 of the waveguide body 20 can effectively provide particle or material sensing in a multi-channel format.

It is noted that terms like "preferably," "commonly," and "typically" are not utilized herein to limit the scope of the claimed invention or to imply that certain features are critical, essential, or even important to the structure or function of the claimed invention. Rather, these terms are merely intended to highlight alternative or additional features that may or may not be utilized in a particular embodiment of the present invention.

For the purposes of describing and defining the present invention it is noted that the term "substantially" is utilized herein to represent the inherent degree of uncertainty that may be attributed to any quantitative comparison, value, measurement, or other representation. The term "substantially" is also utilized herein to represent the degree by which a quantitative representation may vary from a stated reference without resulting in a change in the basic function of the subject matter at issue.

Having described the invention in detail and by reference to specific embodiments thereof, it will be apparent that modifications and variations are possible without departing from the scope of the invention defined in the appended claims. More specifically, although some aspects of the present invention are identified herein as preferred or particularly advantageous, it is contemplated that the present invention is not necessarily limited to these preferred aspects of the invention.

What is claimed is:

1. An integrated optical device configured to multiplex or demultiplex a multi-component optical signal incident upon an input face of said device, said device comprising:
   a waveguide body configured to permit propagation of said optical signal, wherein at least a substantial portion of said waveguide body comprises an optical amplification medium;
   a spectral combiner/divider near a boundary of said waveguide body, wherein said spectral combiner/divider is configured such that a spatial distribution of an optical signal propagating to and from said spectral combiner/divider lies in the plane of said waveguide body and is a function of respective component wavelengths of said multi-component optical signal, and a substantial portion of said optical signal propagates through said optical amplification medium; and
   a primary input/output channel defined in said waveguide body and a set of displaced input/output channels defined in said waveguide body, wherein a displacement of each of said displaced input/output channels from said primary input/output channel is defined at least in part by said spectral combiner/divider.

2. An integrated optical device as claimed in claim 1 wherein a major portion of said waveguide body comprises said optical amplification medium.

3. An integrated optical device as claimed in claim 1 wherein substantially all of said waveguide body comprises said optical amplification medium.

4. An integrated optical device as claimed in claim 1 wherein said waveguide body and said spectral combiner/divider are configured such that at least a portion of said optical signal propagating to said spectral combiner/divider and at least a portion of said optical signal propagating from said spectral combiner/divider propagate through said optical amplification medium.

5. An integrated optical device as claimed in claim 4 wherein:
said primary input output channel, said spectral combiner/divider, and said set of displaced input/output channels define a folded optical path along which said optical signal propagates; and
said optical amplification medium is present along multiple legs of said folded optical path.

6. An integrated optical device as claimed in claim 1 wherein said spectral combiner/divider is configured such that substantially all of said optical signal propagating to and from said spectral combiner/divider in said waveguide body propagates through said optical amplification medium.

7. An integrated optical device as claimed in claim 1 wherein a substantial portion of said optical signal in said primary input/output channel and said set of displaced input/output channels propagates through said optical amplification medium.

8. An integrated optical device as claimed in claim 1 wherein said waveguide body comprises a doped waveguide.

9. An integrated optical device as claimed in claim 1 wherein said waveguide body comprises a doped glass slab.

10. An integrated optical device as claimed in claim 1 wherein said optical amplification medium comprises a doped waveguide material.

11. An integrated optical device as claimed in claim 10 wherein said waveguide material is selected from a glass, a polymer, and combinations thereof.

12. An integrated optical device as claimed in claim 11 wherein said glass comprises silica.

13. An integrated optical device as claimed in claim 10 wherein said doped waveguide material comprises a dopant selected from the rare earth elements and transition metals.

14. An integrated optical device as claimed in claim 1 wherein said spectral combiner/divider is secured to said boundary of said waveguide body.

15. An integrated optical device as claimed in claim 1 wherein said spectral combiner/divider is formed at an interface with said boundary of said waveguide body.

16. An integrated optical device as claimed in claim 1 wherein said spectral combiner/divider is formed in said waveguide body.

17. An integrated optical device as claimed in claim 1 wherein said spectral combiner/divider is optically coupled to said boundary of said waveguide body.

18. An integrated optical device as claimed in claim 1 wherein said spectral combiner/divider is formed integral with said waveguide body as an extension of said waveguide body.

19. An integrated optical device as claimed in claim 1 wherein said spectral combiner/divider comprises a reflective grating structure.

20. An integrated optical device as claimed in claim 19 wherein said grating structure is secured to said waveguide body at a curved interface with said waveguide body.

21. An integrated optical device as claimed in claim 1 wherein said spectral combiner/divider comprises at least one component selected from: a reflective grating structure, an echelle grating, a holographically-formed reflective grating, a Rowland circle grating, a reflector stack, a wavelength selective interference filter, a flat specular reflection surface, a side-tap waveguide grating, a Bragg grating, and a super-dispersive prism, a volume phase grating, and combinations thereof.

22. An integrated optical device as claimed in claim 1 wherein said primary input/output channel and said set of displaced input/output channels are defined in said waveguide body by input/output structure formed within said waveguide body.

23. An integrated optical device as claimed in claim 1 wherein said primary input/output channel and said set of displaced input/output channels are defined in said waveguide body by input/output structure formed at an interface with said waveguide body.

24. An integrated optical device as claimed in claim 1 wherein said primary input/output channel and said set of displaced input/output channels are defined in said waveguide body by input/output structure optically coupled to the waveguide body.

25. An integrated optical device as claimed in claim 1 wherein said displacement of each of said displaced input/output channels includes distance and direction components.

26. An integrated optical device as claimed in claim 1 wherein said primary input output channel, said spectral combiner/divider, and said set of displaced input/output channels define a folded optical path along which said optical signal propagates.

27. An integrated optical device as claimed in claim 26 wherein said integrated optical device further comprises a partially transmissive reflector positioned along said optical path.

28. An integrated optical device as claimed in claim 27 wherein said spectral combiner/divider defines a first fold in said optical path and said partially transmissive reflector defines a second fold in said optical path.

29. An integrated optical device as claimed in claim 28 wherein said integrated optical device further comprises an additional reflector defining a third fold in said optical path.

30. An integrated optical device as claimed in claim 29 wherein said first, second, and third folds in said optical paths are such that said primary input/output channel and said set of displaced input/output channels are defined on a common face of said waveguide body.

31. An integrated optical device as claimed in claim 29 wherein said spectral combiner/divider and said additional reflector are formed at a curved periphery of said waveguide body.

32. An integrated optical device as claimed in claim 27 wherein said partially transmissive reflector is formed in said waveguide body.

33. An integrated optical device as claimed in claim 26 wherein said integrated optical device further comprises an optical signal monitor positioned along said optical path.

34. An integrated optical device as claimed in claim 33 wherein said optical signal monitor comprises a partially transmissive reflector and a detector positioned to receive a portion of said optical signal partially transmitted through said reflector.

35. An integrated optical device as claimed in claim 26 wherein said integrated optical device further comprises an optical signal filter positioned along said optical path.

36. An integrated optical device as claimed in claim 35 wherein said optical signal filter comprises a wavelength selective reflector.

37. An integrated optical device as claimed in claim 1 wherein said primary input/output channel defines a multidirectional path propagating through said optical amplification medium.

38. An integrated optical device as claimed in claim 37 wherein said multidirectional path comprises a spiral component.

39. An integrated optical device as claimed in claim 37 wherein said multidirectional path comprises a folded spiral component.

40. An integrated optical device as claimed in claim 1 wherein said primary input/output channel defines a configuration designed to yield optical signal amplification sufficient to offset optical losses in said integrated optical device.

41. An integrated optical device as claimed in claim 40 wherein a magnitude of said offset is sufficient to balance said signal amplification and said optical losses.

42. An integrated optical device as claimed in claim 40 wherein said configuration of said input/out-put channel relates to a position of said input/output channel relative to a high pump density region of said integrated optical device.

43. An integrated optical device as claimed in claim 42 wherein:
   said integrated optical device further comprises a pump source; and
   said high pump density region is defined by said pump source.

44. An integrated optical device as claimed in claim 1 wherein said integrated optical device is configured to enable balance of optical signal amplification and optical losses attributable to said integrated optical device.

45. An integrated optical device as claimed in claim 44 wherein said balance of said optical signal amplification and said optical losses is a function of one or more of:
   an optical configuration of said primary input/output channel;
   a doping level of said optical amplification medium; and
   an optical length of said optical signal propagating to and from said spectral combiner/divider.

46. An integrated optical device as claimed in claim 45 wherein said optical configuration of said primary input/output channel comprises an optical path length of said primary input/output channel.

47. An integrated optical device as claimed in claim 44 wherein said balance of said optical signal amplification and said optical losses is a function of:
   an optical configuration of said primary input/output channel;
   a doping level of said optical amplification medium; and
   an optical length of said optical signal propagating to and from said spectral combiner/divider.

48. An integrated optical device as claimed in claim 1 wherein a surface of said waveguide body is configured as a sensing region and said waveguide body is configured such that matter present in said sensing region results in attenuation of an optical signal propagating in said waveguide body.

49. An integrated optical device as claimed in claim 48 wherein said waveguide body is configured such that a plurality of waveguide channels corresponding to said displaced input/output channels pass through said sensing region.

50. An integrated optical device as claimed in claim 48 wherein said waveguide body is configured such that a primary waveguide channel corresponding to said primary input/output channel passes through said sensing region.

51. An integrated optical device comprising:
   an erbium or ytterbium-doped glass slab waveguide body configured to permit propagation of an optical signal having multiple spectral components, wherein said waveguide body is doped sufficiently for amplification of said multi-component optical signal; and
   a spectral combiner/divider at a curved periphery of said waveguide body, wherein said curved periphery and said spectral combiner/divider are configured such that said multi-component optical signal propagates from an input/output face of said waveguide body, through said waveguide body to said spectral combiner/divider at said curved periphery of said waveguide body, back through said waveguide body, as reflected by said spectral combiner/divider, and to said input/output face of said waveguide body,
   a spatially condensed optical signal propagating from an input/output face of said waveguide body to said spectral combiner/divider, and from said spectral combiner/divider to said input/output face, is spatially expanded by said spectral combiner/divider according to respective component wavelengths of said multi-component optical signal, and
   a spatially expanded optical signal propagating from an input/output face of said waveguide body to said spectral combiner/divider, and from said spectral combiner/divider to said input/output face, is spatially condensed by said spectral combiner/divider according to respective component wavelengths of said multi-component optical signal, wherein
   said spatially condensed optical signal propagating between said input/output face of said waveguide body and said spectral combiner/divider defines a primary input/output channel in said waveguide body,
   said spatially expanded optical signal propagating between said input/output face of said waveguide body and said spectral combiner/divider defines a set of displaced input/output channels in said waveguide body, and
   a displacement of each of said displaced input/output channels from said primary input/output channel along said input/output face is defined by said spectral combiner/divider.

52. An integrated optical device as claimed in claim 51 further comprises:
   a primary ridge waveguide optically coupled to said waveguide body along said primary input/output channel; and
   a set of displaced ridge waveguides optically coupled to said waveguide body along said set of displaced input/output channels.

53. An integrated optical device as claimed in claim 52 wherein said primary ridge waveguide and said set of displaced ridge waveguides are parallel to each other.

54. An integrated optical device as claimed in claim 51 further comprises:
   a primary buried waveguide optically coupled to said waveguide body along said primary input/output channel; and
   a set of displaced buried waveguides optically coupled to said waveguide body along said set of displaced input/output channels.

55. An integrated optical device as claimed in claim 54 wherein said primary buried waveguide and said set of displaced buried waveguides are parallel to each other.

56. An optical network comprising:
   at least one transmitter configured to transmit an optical signal having multiple spectral components;
   at least one regenerator configured to amplify said multi-component optical signal; and
   at least one receiver configured to receive said multi-component optical signal, wherein at least one of said transmitter, regenerator, and receiver comprise at least one integrated optical device comprising:
a waveguide body configured to permit propagation of an optical signal having multiple spectral components, wherein at least a substantial portion of said waveguide body comprises an optical amplification medium;
a spectral combiner/divider near a boundary of said waveguide body, wherein said spectral combiner/divider is configured such that
a spatial distribution of an optical signal propagating to and from said spectral combiner/divider is a function of respective component wavelengths of said multi-component optical signal, and
a substantial portion of said optical signal propagates through said optical amplification medium; and
a primary input/output channel defined in said waveguide body and a set of displaced input/output channels defined in said waveguide body, wherein a displacement of each of said displaced input/output channels from said primary input/output channel is defined at least in part by said spectral combiner/divider.

57. An optical network as claimed in claim 56 wherein said transmitter comprises said integrated optical device and said primary input/output channel is coupled to an input channel of said regenerator.

58. An optical network as claimed in claim 56 wherein said receiver comprises said integrated optical device and said primary input/output channel is coupled to an output channel of said regenerator.

59. An optical network as claimed in claim 56 wherein said regenerator comprises said integrated optical device and said primary input/output channel is coupled to an output channel of said transmitter.

60. An optical network as claimed in claim 56 wherein said optical network comprises a plurality of said integrated optical devices.

61. An optical network as claimed in claim 60 wherein said transmitter comprises one of said plurality of integrated optical devices and said receiver comprises another of said plurality of integrated optical devices.

62. An optical network as claimed in claim 60 wherein said transmitter comprises one of said plurality of integrated optical devices, said receiver comprises another of said plurality of integrated optical devices, and said regenerator comprises yet another of said plurality of integrated optical devices.

63. A telecommunications network comprising:
at least one telecommunications transmitter configured to transmit an optical telecommunications signal having multiple spectral components;
at least one regenerator configured to amplify said multi-component optical signal; and
at least one telecommunications receiver configured to receive said multi-component optical signal, wherein at least one of said transmitter, regenerator, and receiver comprise an integrated optical device comprising:
a waveguide body configured to permit propagation of an optical signal having multiple spectral components, wherein at least a substantial portion of said waveguide body comprises an optical amplification medium;
a spectral combiner/divider near a boundary of said waveguide body, wherein said spectral combiner/divider is configured such that a spatial distribution of an optical signal propagating to and from said spectral combiner/divider is a function of respective component wavelengths of said multi-component optical signal; and
a primary input/output channel defined in said waveguide body and a set of displaced input/output channels defined in said waveguide body, wherein a displacement of each of said displaced input/output channels from said primary input/output channel is defined at least in part by said spectral combiner/divider.

64. An integrated optical device comprising:
an optical signal having multiple spectral components;
a substantially planar waveguide body configured to permit propagation of said optical signal having multiple spectral components in the plane of said waveguide body, wherein at least a substantial portion of said waveguide body comprises an optical amplification medium;
a spectral combiner/divider near a boundary of said waveguide body, wherein said spectral combiner/divider is configured such that a spatial distribution of an optical signal propagating to and from said spectral combiner/divider lies in the plane of said waveguide body and is a function of respective component wavelengths of said multi-component optical signal; and
a primary input/output channel defined in said waveguide body and a set of displaced input/output channels defined in said waveguide body, wherein
said multi-component optical signal is incident upon an input face of said waveguide body via either said primary input/output channel or said set of displaced input/output channels, and
a displacement of each of said displaced input/output channels from said primary input/output channel is defined at least in part by said spectral combiner/divider.

65. An integrated optical device configured to multiplex or demultiplex a multi-component optical signal, said device comprising:
an optical signal having multiple spectral components;
a waveguide body configured to permit propagation of said optical signal having multiple spectral components in the plane of said waveguide body, wherein at least a substantial portion of said waveguide body comprises an optical amplification medium;
a spectral combiner/divider near a boundary of said waveguide body, wherein said spectral combiner/divider is configured such that a spatial distribution of an optical signal propagating to and from said spectral combiner/divider is a function of respective component wavelengths of said multi-component optical signal and such that a divided optical signal passes through said optical amplification medium; and
a primary input/output channel defined in said waveguide body and a set of displaced input/output channels defined in said waveguide body, wherein a displacement of each of said displaced input/output channels from said primary input/output channel is defined at least in part by said spectral combiner/divider.

* * * * *